(12) United States Patent
Wang et al.

(10) Patent No.: US 11,088,283 B2
(45) Date of Patent: Aug. 10, 2021

(54) THIN FILM TRANSISTOR, METHOD OF FABRICATING THIN FILM TRANSISTOR AND ARRAY SUBSTRATE

(71) Applicant: BOE TECHNOLOGY GROUP CO., LTD., Beijing (CN)

(72) Inventors: Guoying Wang, Beijing (CN); Zhen Song, Beijing (CN); Hongda Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 40 days.

(21) Appl. No.: 16/330,990

(22) PCT Filed: Aug. 27, 2018

(86) PCT No.: PCT/CN2018/102505
§ 371 (c)(1),
(2) Date: Mar. 6, 2019

(87) PCT Pub. No.: WO2019/042251
PCT Pub. Date: Mar. 7, 2019

(65) Prior Publication Data
US 2019/0267493 A1 Aug. 29, 2019

(30) Foreign Application Priority Data
Aug. 28, 2017 (CN) .......................... 201710749797.9

(51) Int. Cl.
*H01L 29/786* (2006.01)
*H01L 29/417* (2006.01)
(Continued)

(52) U.S. Cl.
CPC ........ *H01L 29/78648* (2013.01); *H01L 29/41* (2013.01); *H01L 29/41733* (2013.01);
(Continued)

(58) Field of Classification Search
CPC ......... H01L 29/78648; H01L 29/41733; H01L 29/786; H01L 29/78633
See application file for complete search history.

(56) References Cited

U.S. PATENT DOCUMENTS 5,338,959 A * 8/1994 Kim .................. H01L 29/42392
257/331
5,808,317 A * 9/1998 Kuo .................. H01L 29/42384
257/401

(Continued)

FOREIGN PATENT DOCUMENTS

| CN | 101097871 A | 1/2008 |
|---|---|---|
| CN | 107482055 A | 12/2017 |
| CN | 207124196 U | 3/2018 |

OTHER PUBLICATIONS

International Search Report dated Dec. 3, 2018 issued in corresponding International Application No. PCT/CN2018/102505.

*Primary Examiner* — Khaja Ahmad
*Assistant Examiner* — Khatib A Rahman
(74) *Attorney, Agent, or Firm* — Nath, Goldberg & Meyer; Joshua B. Goldberg

(57) ABSTRACT

The present application provides a thin film transistor, a method of fabricating a thin film transistor and an array substrate. The thin film transistor includes: a gate electrode on a substrate and having first and second side surfaces facing each other; and an active layer between the first side surface and the second side surface of the gate electrode and having a third side surface and a fourth side surface. The third side surface of the active layer and the first side surface of the gate electrode face and are spaced apart from each other, the fourth side surface of the active layer and the second side surface of the gate electrode face and are spaced apart from each other, and at least one portion of the gate (Continued)

electrode is in the same range as at least one portion of the active layer in a height direction.

<div align="center">12 Claims, 6 Drawing Sheets</div>

(51) Int. Cl.
  *H01L 29/423* (2006.01)
  *H01L 29/66* (2006.01)
  *H01L 29/41* (2006.01)
(52) U.S. Cl.
  CPC .. *H01L 29/42384* (2013.01); *H01L 29/66742* (2013.01); *H01L 29/786* (2013.01); *H01L 29/78633* (2013.01)

(56) References Cited

<div align="center">U.S. PATENT DOCUMENTS</div>

| | | | | |
|---|---|---|---|---|
| 5,834,797 | A * | 11/1998 | Yamanaka | G02F 1/1362 |
| | | | | 257/57 |
| 5,937,283 | A | 8/1999 | Lee | |
| 7,691,695 | B2 * | 4/2010 | Ponomarev | H01L 29/785 |
| | | | | 438/197 |
| 10,038,074 | B2 * | 7/2018 | Chi | H01L 29/78678 |
| 2015/0280008 | A1 * | 10/2015 | Sun | H01L 29/78696 |
| | | | | 257/72 |
| 2016/0079440 | A1 * | 3/2016 | Ellinger | H01L 29/7869 |
| | | | | 257/43 |
| 2016/0307932 | A1 * | 10/2016 | Ge | H01L 27/3248 |
| 2018/0308868 | A1 * | 10/2018 | Tan | G02F 1/133512 |

\* cited by examiner

US 11,088,283 B2

THIN FILM TRANSISTOR, METHOD OF FABRICATING THIN FILM TRANSISTOR AND ARRAY SUBSTRATE

CROSS-REFERENCE TO RELATED APPLICATION

This is a National Phase Application filed under 35 U.S.C. 371 as a national stage of PCT/CN2018/102505, filed on Aug. 27, 2018, an application claiming the benefit of Chinese Patent Application No. 201710749797.9, filed to the State Intellectual Property Office of P.R. China on Aug. 28, 2017, the contents of which are incorporated herein by reference in the entirety.

TECHNICAL FIELD

The present application belongs to the field of display technology, and specifically relates to a thin film transistor, a method of fabricating a thin film transistor and an array substrate.

BACKGROUND

Thin film transistors (TFTs) are important semiconductor devices, and play an important role especially in flat panel display devices. Current flat panel display devices include LCD (liquid crystal display) and OLED (organic light emitting diode) display devices.

However, existing thin film oxide transistors still have some problems that hinder improvement of their performance.

SUMMARY

In an aspect, embodiments of the present disclosure provide a thin film transistor, which includes:

a gate electrode on a substrate and having a first side surface and a second side surface facing each other; and an active layer between the first side surface and the second side surface of the gate electrode and having a third side surface and a fourth side surface. The third side surface of the active layer and the first side surface of the gate electrode are facing and spaced apart from each other, the fourth side surface of the active layer and the second side surface of the gate electrode face and are spaced apart from each other, and at least one portion of the gate electrode is in the same range as at least one portion of the active layer in a height direction.

In some embodiments, the gate electrode includes a first portion and a second portion separated from each other. The first portion is provided with a recess concave toward the substrate, the recess defines the first side surface, the second side surface, and a fifth surface of the gate electrode, the fifth surface connects the first side surface and the second side surface, and the at least one portion of the active layer is in the recess and has a sixth surface facing and spaced apart from the fifth surface. The second portion is on a side of the active layer away from the substrate, and an orthographic projection of the second portion on the substrate at least partially overlaps an orthographic projection of the active layer on the substrate.

In some embodiments, the thin film transistor further includes a source electrode and a drain electrode, the source electrode and the drain electrode are at substantially the same level as the active layer, and the source electrode and the drain electrode are respectively on opposite two sides of the active layer in a horizontal direction and electrically coupled to the active layer.

In some embodiments, the first portion extends along a first direction, and the source electrode, the active layer, and the drain electrode are sequentially arranged along a second direction, the first direction and the second direction being perpendicular to each other.

In some embodiments, the gate electrode includes a first portion and a second portion separated from each other. The first portion has the first side surface and the second portion has the second side surface. The first portion and the second portion are in the same range as the at least one portion of the active layer in the height direction, and the first portion and the second portion are respectively on opposite two sides of the active layer in the horizontal direction and spaced apart from the active layer.

In some embodiments, the gate electrode further includes a third portion separated from the first portion and the second portion, the third portion being on a side of the active layer away from the substrate and an orthographic projection of the third portion on the substrate completely overlapping the orthographic projection of the active layer on the substrate.

In some embodiments, the thin film transistor further includes a source electrode and a drain electrode, the source electrode and the drain electrode being at substantially the same level as the active layer, and the source electrode and the drain electrode being respectively on opposite two sides of the active layer in the horizontal direction and electrically coupled to the active layer.

In some embodiments, the first portion and the second portion are arranged along a first direction, and the source electrode, the active layer, and the drain electrode are sequentially arranged along a second direction, the first direction and the second direction being perpendicular to each other.

In some embodiments, the thin film transistor further includes a source electrode and a drain electrode, one of the source electrode and the drain electrode is on a side of the active layer proximal to the substrate and electrically coupled to the active layer, and the other of the source electrode and the drain electrode is on a side of the active layer away from the substrate and electrically coupled to the active layer.

In some embodiments, orthographic projections of the source electrode, the active layer, and the drain electrode on the substrate completely overlap each other.

In some embodiments, a center connection line connecting a center of the first portion and a center of the second portion is perpendicular to a center connection line connecting a center of the source electrode and a center of the drain electrode.

In some embodiments, the gate electrode is made of a material capable of shielding light.

In another aspect, embodiments of the present disclosure provide a method of fabricating a thin film transistor, which includes: forming a gate electrode on a substrate, the gate electrode being formed to have a first side surface and a second side surface facing each other; and forming an active layer, the active layer being formed to be between the first side surface and the second side surface of the gate electrode and have a third side surface and a fourth side surface. The active layer and the gate electrode are formed such that the third side surface of the active layer and the first side surface of the gate electrode face and are spaced apart from each other, the fourth side surface of the active layer and the second side surface of the gate electrode face and are spaced apart from each other, and at least one portion of the gate electrode is in the same range as at least one portion of the active layer in a height direction.

In some embodiments, the step of forming the gate electrode includes forming a first portion of the gate electrode and forming a second portion of the gate electrode. The first portion of the gate electrode is formed to have a recess concave toward the substrate, the recess defines the first side surface, the second side surface, and a fifth surface of the gate electrode, the fifth surface connects the first side surface and the second side surface, and the active layer is formed such that the at least one portion of the active layer is in the recess and has a sixth surface facing and spaced apart from the fifth surface. The method further incudes steps of: after forming the first portion and before forming the active layer, forming a first insulation layer on a side of the active layer away from the substrate; after forming the active layer, forming a source electrode and a drain electrode on opposite two sides of the active layer in a horizontal direction, the source electrode and the drain electrode being formed to be electrically coupled to the active layer; and after forming the source electrode and the drain electrode, forming a second insulation layer on a side of the active layer, the source electrode and the drain electrode away from the substrate. The step of forming the second portion is after the step of forming the second insulation layer, the second portion is formed on the side of the active layer away from the substrate, and an orthographic projection of the second portion on the substrate at least partially overlaps an orthographic projection of the active layer on the substrate.

In some embodiments, the first portion is formed of a conductive material that can be oxidized. The step of forming the first insulation layer includes: forming the first insulation layer by oxidizing the first portion such that an insulation layer of a predetermined thickness is formed on a surface of the first portion by self-alignment growth.

In some embodiments, the step of forming the gate electrode includes forming a first portion and a second portion separated from each other, the first portion is formed to have the first side surface, the second portion is formed to have the second side surface, and the first portion and the second portion are formed to be in the same range as the at least one portion of the active layer in the height direction and respectively on opposite two sides of the active layer in the horizontal direction and spaced apart from the active layer. The method further includes steps of: after forming the active layer, forming a first insulation layer and a third portion of the gate electrode on a side of the active layer away from the substrate, the third portion being formed to be between the first portion and the second portion and separated from the first portion and the second portion, and an orthographic projection of the third portion on the substrate completely overlapping the orthographic projection of the active layer on the substrate; after forming the first insulation layer and the third portion of the gate electrode, forming a source electrode and a drain electrode on opposite two sides of the active layer in the horizontal direction, the source electrode and the drain electrode being formed to be at substantially the same level as the active layer and electrically coupled to the active layer; and after forming the source electrode and the drain electrode, forming a second insulation layer on a side of the active layer, the source electrode and the drain electrode away from the substrate.

In some embodiments, the step of forming the first portion and the second portion of the gate electrode includes: forming a gate film layer and a photoresist layer, the photoresist layer being formed to cover the gate film layer and have an opening exposing a portion of the gate film layer; and wet-etching the gate film layer to completely remove the portion of the gate film layer exposed by the opening and remove a portion of the gate film layer that is in contact with the portion exposed by the opening in the horizontal direction, thereby forming the first portion and the second portion separated from each other. The step of forming the active layer, the first insulation layer, and the third portion of the gate electrode includes: sequentially forming the active layer, the first insulation layer and the third portion through the opening of the photoresist layer by a self-alignment method, such that orthographic projections of the opening, the active layer, the first insulation layer, and the third portion on the substrate completely overlap each other; and peeling off the photoresist layer.

In some embodiments, the step of forming the gate electrode includes forming a first portion and a second portion separated from each other, the first portion is formed to have the first side surface, the second portion is formed to have the second side surface, and the first portion and the second portion are formed to be in the same range as the at least one portion of the active layer in the height direction and respectively on opposite two sides of the active layer in the horizontal direction and spaced apart from the active layer. The method further includes steps of: before forming the active layer, forming a source electrode on the substrate, the source electrode being formed to be between the first portion and the second portion; after forming the active layer, forming a drain electrode on a side of the active layer away from the source electrode; and forming an insulation layer on a side of the first portion, the second portion and the drain electrode away from the substrate.

In some embodiments, the step of forming the first portion and the second portion of the gate electrode includes: forming a gate film layer and a photoresist layer, the photoresist layer being formed to cover the gate film layer and have an opening exposing a portion of the gate film layer; and wet-etching the gate film layer to completely remove the portion of the gate film layer exposed by the opening and remove a portion of the gate film layer that is in contact with the portion exposed by the opening in the horizontal direction, so as to form the first portion and the second portion separated from each other. The step of forming the active layer, the source electrode and the drain electrode includes: sequentially forming the source electrode, the active layer and the drain electrode through the opening of the photoresist layer by a self-alignment method, such that orthographic projections of the opening, the source electrode, the active layer and the drain electrode on the substrate completely overlap each other; and peeling off the photoresist layer.

In another aspect, the embodiments of the present disclosure provide an array substrate including the above thin film transistor.

DETAILED DESCRIPTION

To make those skilled in the art better understand the technical solutions of the present disclosure, an thin film transistor, a method of fabricating a thin film transistor and an array substrate according to the present disclosure will be further described in detail below in conjunction with the accompanying drawings and specific implementations.

In the thin film transistors used for the display device, the thin film transistors may include a-Si thin film transistors (a-Si TFTs) and oxide thin film transistors (oxide TFTs) depending on materials forming the respective active layers. The oxide thin film transistors have the advantages of high mobility, low process temperature, high reliability and so on compared with the a-Si thin film transistors, and are considered to be the technology that has the most potential to replace the a-Si thin film transistors. In addition, with the incomparable uniformity over the low temperature polysilicon (LTPS) technology, the oxide thin film transistors have received much attention in large-size OLED display technology.

Figure 1:
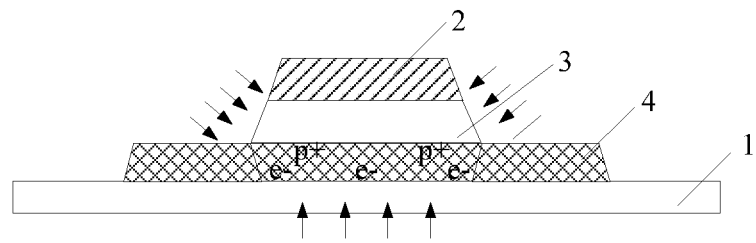
FIG. 1 is a schematic diagram illustrating the influence of illumination on an active layer under a negative bias voltage applied to a gate electrode of a thin film transistor in the prior art.

On the other hand, since a top gate thin film transistor has a small parasitic capacitance, it is widely used in a fabrication process of an array substrate. However, due to the problems such as a large source-drain contact resistance $R_{SD}$ that is caused by a large number of interface trap defects between the active layer and the gate insulation layer and insufficient conductorization, the on current Ion of the thin film transistor cannot be further improved. Moreover, the illumination stability of the oxide thin film transistor is also a problem that currently troubles the industry. As illustrated in FIG. 1, in an existing thin film transistor, under the illumination and the bias voltage of the gate electrode 2, a large number of electron-hole pairs are generated in the region of the active layer 4, and thus the problem of poor negative bias illumination stability (NBIS) occurs, which leads to a large negative drift of the threshold ($V_{TH}$) of the oxide thin film transistor and results in problems such as uneven display.

Accordingly, the present disclosure provides, inter alia, a thin film transistor, a method of fabricating a thin film transistor and an array substrate that substantially obviate one or more of the problems due to limitations and disadvantages of the related art.

In one aspect, the embodiments of the present disclosure provide a thin film transistor, which includes: a gate electrode on a substrate and having a first side surface and a second side surface facing each other; and an active layer between the first side surface and the second side surface of the gate electrode and having a third side surface and a fourth side surface. The third side surface of the active layer and the first side surface of the gate electrode face and are spaced apart from each other, the fourth side surface of the active layer and the second side surface of the gate electrode face and are spaced apart from each other, and at least one portion of the gate electrode is in the same range as at least one portion of the active layer in the height direction. In this thin film transistor, the distribution of the gate electrode, a source electrode and a drain electrode with respect to the active layer is set such that the active layer is in contact with the source electrode and the drain electrode in multiple directions, which, on the one hand, shields the active layer from light, and on the other hand, increases the contact area of the source and drain electrodes with the active layer; and at the same time, by fully utilizing the side surface of the active layer side, the area of the active layer facing the gate electrode is increased, thereby increasing the on current Ion.

In another aspect, the embodiments of the present disclosure provide a method of fabricating a thin film transistor, which includes: forming a gate electrode on a substrate, the gate electrode being formed to have a first side surface and a second side surface facing each other; and forming an active layer, the active layer being formed to be between the first side surface and the second side surface of the gate electrode and have a third side surface and a fourth side surface. The active layer and the gate electrode are formed such that the third side surface of the active layer and the first side surface of the gate electrode face and are spaced apart from each other, the fourth side surface of the active layer and the second side surface of the gate electrode face and are spaced apart from each other, and at least one portion of the gate electrode is in the same range as at least one portion of the active layer in the height direction.

In the present disclosure, a photolithography process refers to a process of forming a pattern by using a photoresist, a mask plate, an exposure machine, and the like, including processes of exposure, development, etching, and the like.

In the present disclosure, A is in the same range as B in a height direction means that, A is at the same level as B, for example, an orthografic projection of A on a vertical plane in which the height direction is included overlaps an orthographic projection of A on the vertical plane.

Figure 2A:
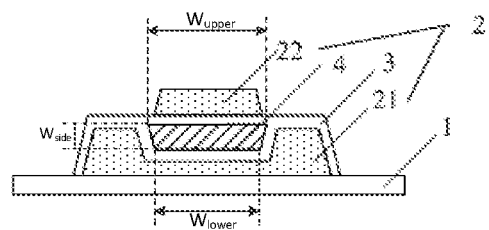
FIG. 2A is a structural cross-sectional view of a thin film transistor according to an embodiment of the present disclosure.
Figure 2B:
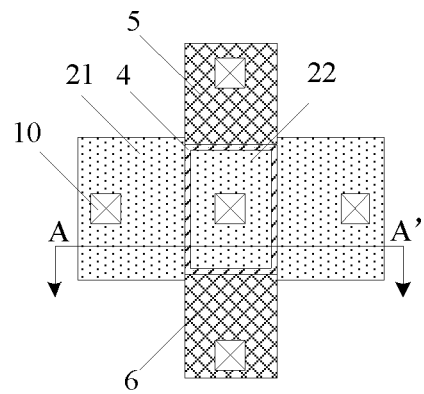
FIG. 2B is a top view of the thin film transistor according to the embodiment of the present disclosure.

FIGS. 2A and 2B illustrate a thin film transistor in some embodiments, and FIG. 2A is a cross-sectional view taken along a line AA' of FIG. 2B. As illustrated in FIGS. 2A and 2B, the thin film transistor includes a gate electrode 2, an active layer 4, a gate insulation layer 3, a source electrode 5 (not shown in the cross-sectional view of FIG. 2A), and a drain electrode 6 (not shown in the cross-sectional view of FIG. 2A). The gate electrode 2 includes a bottom gate electrode 21 (an example of a first portion of the gate electrode in FIGS. 2A to 3E) and a top gate electrode 22 (an example of a second portion of the gate electrode in FIGS. 2A to 3E). The bottom gate electrode 21 is strip-shaped, and a middle area thereof is provided with a recess concave toward the substrate, the recess defining first and second side surfaces and a fifth surface of the gate electrode 2 (i.e., an upper surface of the gate electrode 2 facing the active layer 4 in the figures), and the first side surface and the second side surface facing each other. The active layer 4 is on the bottom gate electrode 21 and within the recess, and has a third side surface, a fourth side surface, and a sixth surface (i.e., a lower surface of the active layer 4 in the figures) facing and spaced apart from the fifth surface of the gate electrode 2. The third side surface faces and is insulated and spaced apart from the first side surface of the gate electrode 2, and the fourth side surface faces and is insulated and spaced apart from the second side surface of the gate electrode 2. The top gate electrode 22 is on the active layer 4. Referring to FIG. 2B, the source electrode 5 and the drain electrode 6 are in the same layer as the active layer 4 such that the source electrode 5 and the drain electrode 6 are at substantially the same level as the active layer 4, and the source electrode 5 and the drain electrode 6 are respectively on opposite two sides of the active layer 4 in a horizontal direction and electrically coupled to the active layer 4. The thin film transistor is designed to have a bottom-gate-plus-top-gate structure such that the active layer 4 faces the gate electrode 2 with an insulation layer (e.g., the gate insulation layer 3) therebetween on, for example, four sides of the left side, the right side, the upper side, and the lower side shown in FIG. 2A, respectively, and is in contact with the source electrode 5 and the drain electrode 6 on the front side and the back side (the upper side and the lower side of FIG. 2B), respectively, thereby increasing the contact area and increasing the on current Ion. In some embodiments, the gate electrode 2 is made of a material capable of shielding light to shield the active layer 4 from light, thereby improving the negative bias illumination stability of the thin film transistor.

In some embodiments, as illustrated in FIG. 2B, an extending direction of the bottom gate electrode 21 is a first direction, an arrangement direction of the source electrode 5, the active layer 4, and the drain electrode 6 is a second direction, and the first direction and the second direction are perpendicular to each other. By setting the distribution of the source electrode 5, the drain electrode 6, the bottom gate electrode 21 and the top gate electrode 22 with respect to the active layer 4, the on current Ion is increased.

It is readily understood that the source electrode 5 and the drain electrode 6 of the thin film transistor are symmetric in position, have the same structure, and are functionally interchangeable. Moreover, via holes 10 are also illustrated in FIG. 2B to facilitate electrical connections between different layer structures.

A method of fabricating the thin film transistor in FIGS. 2A and 2B will be described below. In fabricating the thin film transistor, a thick layer of conductive material (e.g., a conductive metal material that is liable to oxidization) is deposited on a substrate 1 as a gate film layer and patterned into the bottom gate electrode 21 (for example, the bottom gate electrode 21 is made of a material capable of shielding light), and the bottom gate electrode 21 has a recess; an insulation layer, as a first gate insulation layer 31, of a proper thickness is formed on a surface of the bottom gate electrode 21 by self-alignment growth through a method of anode oxidization or thermal oxidization, the active layer 4 is formed within the recess, and finally, a second gate insulation layer 32 and the top gate electrode 22 are deposited and patterned. The first gate insulation layer 31 and the second gate insulation layer 32 together constitute the gate insulation layer 3.

As illustrated in FIGS. 3A to 3E, the method of fabricating the thin film transistor specifically includes the following steps S1 to S5.

In step S1, a strip-shaped bottom gate electrode 21, whose middle area is provided with a recess concave toward the substrate 1, is formed.

Figure 3A:
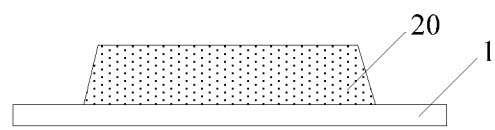
FIGS. 3A to 3E are schematic diagrams illustrating a fabrication process of the thin film transistor shown in FIG. 2A.

In this step, the bottom gate electrode 21 is formed of a conductive material that is liable to oxidization. As illustrated in FIG. 3A, after the substrate 1 is cleaned by a standard method, a layer of conductive metal material, which is liable to oxidization, is first deposited on the substrate 1 as the gate film layer 20, and patterned to form an island-like structure.

Figure 3B:
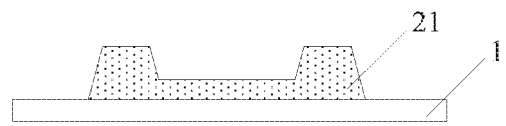

Then, the bottom gate electrode 21 is formed by coating a photoresist on the gate film layer 20 and forming a recess on the gate film layer 20, as illustrated in FIG. 3B.

In step S2, a first insulating layer is formed over the bottom gate electrode 21.

Figure 3C:
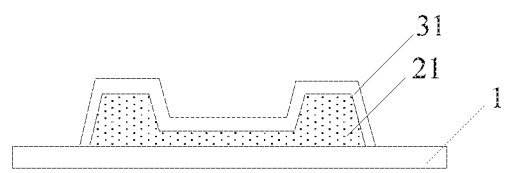

In this step, the bottom gate electrode 21 is oxidized such that an insulation layer of a predetermined thickness is formed on a surface of the bottom gate electrode 21 by self-alignment growth, thereby forming a first gate insulation layer 31 (i.e., the first insulation layer). Self-alignment growth technology is a technology for realizing self-alignment in optical copying by utilizing structural features of components and devices in microelectronics technology, that is, a process in which a subsequent lamination structure is patterned by using, as a mask, a layer that has already been patterned instead of the developed photoresist. The self-alignment has the advantages of saving the number of masks and reducing the manufacture cost, and as a process, it can achieve accurate alignment of upper and lower layers to avoid alignment deviation between two photolithography processes. As illustrated in FIG. 3C, an insulation layer of a proper thickness is grown by self-alignment on a surface of the bottom gate electrode 21 as the first gate insulation layer 31, through a method of anode oxidization or thermal oxidization. Due to the characteristics of self-alignment, the process is simple and the quality of the obtained insulation layer is good, and the control effect of the bottom gate electrode 31 on the active layer 4 is ensured.

In step S3, the active layer 4 is formed on the first gate insulation layer 31 within the recess of the bottom gate electrode 21.

Figure 3D:
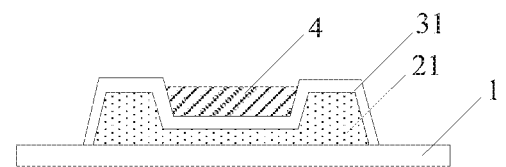

In this step, as illustrated in FIG. 3D, a transparent conductive oxide is filled, as the active layer 4, in the recess of the bottom gate electrode 21 and the first gate insulation layer 31 by sputtering, evaporation or sol-gel method, and a material of the transparent conductive oxide includes aluminum-doped zinc oxide (AZO), indium zinc oxide (IZO), indium gallium zinc oxide (IGZO) or the like.

In step S4, a source electrode 5 and a drain electrode 6 are formed on opposite two sides of the active layer 4 in a horizontal direction.

In this step, referring to FIG. 2B, a source/drain film layer is deposited on both sides of the active layer 4 (i.e., both sides in a direction perpendicular to the extending direction of the bottom gate electrode 21) and etched to form the source electrode 5 and the drain electrode 6.

In step S5, a second insulation layer and the top gate electrode 22 are formed on the active layer 4, the source electrode 5, and the drain electrode 6.

Figure 3E:
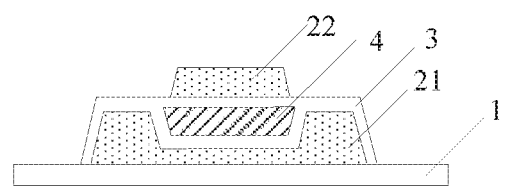

In this step, as illustrated in FIG. 3E, on the basis of step S4, a second gate insulation layer 32 (i.e., a second insulation layer) and a gate film layer are sequentially deposited, and a photolithography process is performed on the gate film layer to form a top gate electrode 22.

In the method of fabricating the thin film transistor, by preparing each layer structure through layout design and growing the insulation layer through self-alignment on the bottom gate electrode structure, the active layer 4 faces the gate electrode 2 on multiple sides with an insulation layer therebetween, and is in contact with the source electrode 5 and the drain electrode 6 respectively on both sides, thereby increasing the contact area and increasing the on current Ion.

The thin film transistor structure according to the embodiments of the present disclosure effectively implements the encirclement of the active layer 4, minimizes the influence of illumination on the $V_{TH}$ drift of the device, and solves the problem of poor NBIS of current oxide thin film transistors.

The thin film transistor structure according to the embodiments of the present disclosure utilizes the anode oxidization process to fabricate the gate electrode structure encircling the active layer, and can shield the active layer from light and fully utilize the sides of the active layer to participate in conduction so as to increase the on current Ion, thereby having high reliability.

Figure 4A:
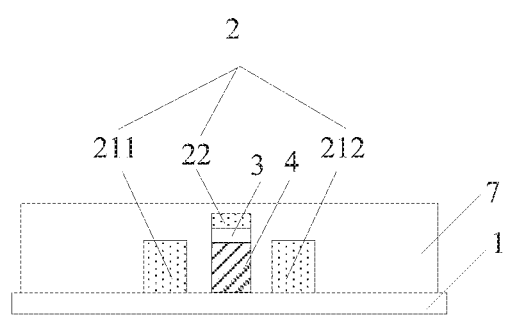
FIG. 4A is a structural cross-sectional view of a thin film transistor according to an embodiment of the present disclosure.
Figure 4B:
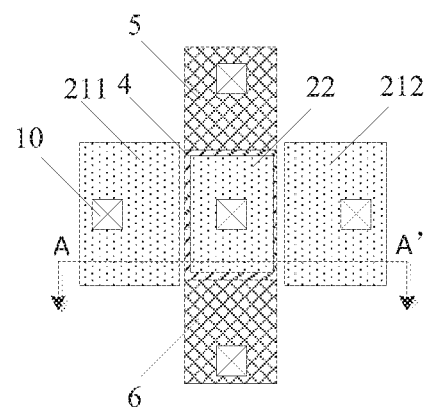
FIG. 4B is a top view of the thin film transistor according to the embodiment of the present disclosure.

FIGS. 4A and 4B show a thin film transistor in some embodiments, and FIG. 4A is a cross-sectional view taken along line AA' of FIG. 4B. As illustrated in FIGS. 4A and 4B, in this thin film transistor, the gate electrode 2 includes a first bottom gate electrode 211 (an example of the first portion of the gate electrode in FIGS. 4A to 5F), a second bottom gate electrode 212 (an example of the second portion of the gate electrode in FIGS. 4A to 5F) and a top gate electrode 22 (an example of the third portion of the gate electrode in FIGS. 4A to 5F). The first bottom gate electrode 211, the second bottom gate electrode 212, and the active layer 4 are in a same layer such that at least a portion of the gate electrode 2 is in the same range as the active layer 4 in the height direction. The first bottom gate electrode 211 and the second bottom gate electrode 212 respectively have the first side surface and the second side surface of the gate electrode 2 facing each other (for example, a right side surface of the first bottom gate electrode 211 and a left side surface of the second bottom gate electrode 212). The top gate electrode 22 is on the active layer 4 and its orthographic projection on the substrate 1 fully overlaps that of the active layer 4 on the substrate 1. The active layer 4 is between the first bottom gate electrode 211 and the second bottom gate electrode 212, and has a third side surface (for example, a left side surface of the active layer 4 in the figures) facing, insulated from and spaced apart from the first side surface of the gate electrode 2 and a fourth side surface (for example, a right side surface of the active layer 4 in the figures) facing, insulated from and spaced apart from the second side surface of the gate electrode 2. Referring to FIG. 4B, the source electrode 5 and the drain electrode 6 are in the same layer as the active layer 4 such that the source electrode 5 and the drain electrode 6 are at substantially the same level as the active layer 4, and the source electrode 5 and the drain electrode 6 are respectively on opposite two sides of the active layer 4 in a horizontal direction and electrically coupled to the active layer 4. The thin film transistor is designed to have a bottom-gate-plus-top-gate structure such that the active layer 4 faces the gate electrode 2 with an insulation layer therebetween, and is in contact with the source electrode 5 and the drain electrode 6 on both sides, thereby increasing the contact area and increasing the on current Ion.

In some embodiments, as illustrated in FIG. 4B, the first bottom gate electrode 211 and the second bottom gate electrode 212 are arranged along a first direction, and the source electrode 5, the active layer 4, and the drain electrode 6 are arranged along a second direction, the first direction and the second direction being perpendicular to each other. By setting the distribution of the source electrode 5, the drain electrode 6, and the bottom gate electrode 21 with respect to the active layer 4, the contact area is increased and the on current Ion is increased.

The first bottom gate electrode 211 and the second bottom gate electrode 212 formed in the thin film transistor may be applied with a gate voltage to form a conductive path on the sides of the active layer 4, which is equivalent to increasing the width of the conductive channel, thereby improving the current driving capability of the thin film transistor.

A method of fabricating the thin film transistor in FIGS. 4A and 4B will be described below. In the fabrication of the thin film transistor, a layer of conductive material (for example, a conductive metal material) is deposited on the substrate 1, and undergoes a photolithography process to form an island-like structure, and then the patterns of the first bottom gate electrode 211 and the second bottom gate electrode 212 are formed by utilizing the lateral etching characteristics of wet etching. Then, by using a photoresist as a self-alignment mask, the active layer 4, the gate insulation layer 3, and the top gate electrode 22 are formed by lift-off.

As illustrated in FIGS. 5A to 5F, the method of fabricating the thin film transistor specifically includes the following steps S1 to S4.

In step S1, the first bottom gate electrode 211 and the second bottom gate electrode 212 separated from each other are formed. Step S1 includes steps S11 and S12.

In step S11, the gate film layer 20 and the photoresist layer 8 are formed, and the photoresist layer 8 is formed to have an opening exposing a portion of the gate film layer 20.

Figure 5A:
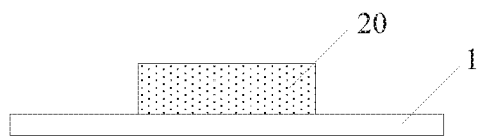
FIGS. 5A to 5F are schematic diagrams illustrating a fabrication process of the thin film transistor shown in FIG. 4A.

In this step, after the substrate 1 is cleaned by a standard method, a layer of conductive metal material or other conductive material is deposited on the substrate 1 as the gate film layer 20, and is subjected to a photolithography process to form an island-like structure, as illustrated in FIG. 5A.

Figure 5B:
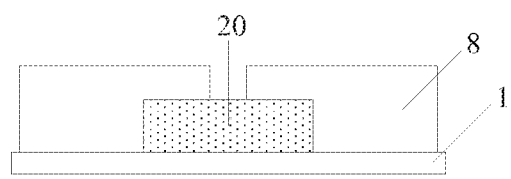

A photoresist is coated on the substrate 1 and the gate film layer 20, and the photoresist in the middle of the gate film layer 20 is removed by a photolithography process (exposure, development, etc.) to form the photoresist layer 8 having an opening, as illustrated in FIG. 5B. By using a special photoresist material, by lowering the temperature of the photoresist in the baking and not performing the post-baking process, or by other methods, the adhesion between the photoresist and the gate electrode layer is reduced, which is advantageous for the lateral etching in the next step of wet etching.

In step S12, the gate film layer is subjected to wet etching so that the liquid etchant laterally etches at the contact surface of the photoresist layer 8 with the gate film layer, thereby completely removing the portion (for example, the orthographic projection of the portion on the substrate 1 completely overlaps the orthographic projection of the opening on the substrate 1) of the gate film layer 20 exposed by the opening and removing a portion of the gate film layer 20 that is in contact with the portion exposed by the opening in the horizontal direction, so as to form the first bottom gate electrode 211 and the second bottom gate electrode 212 separated from each other.

Figure 5C:
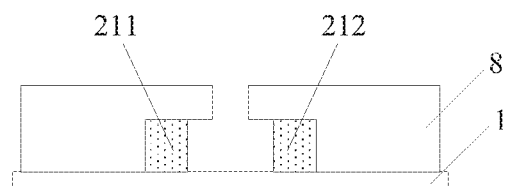

In this step, the substrate 1 that has already been subjected to step S11 is placed in the liquid etchant for wet etching, and since the adhesion between the photoresist and the gate film layer 20 is small, the liquid etchant conducts lateral etching of a certain degree under the photoresist while etching the material downwardly, that is, the phenomenon of undercutting occurs, and this phenomenon is utilized to form the structure of the bottom gate electrode, in which the first bottom gate electrode 211 and the second bottom gate electrode 212 separated from each other are formed, as illustrated in FIG. 5C.

In step S2, an active layer 4, a first insulation layer, and a top gate electrode 22 are formed between the first bottom gate electrode 211 and the second bottom gate electrode 212. Step S2 includes steps S21 and S22.

In step S21, the active layer 4, the gate insulation layer 3 (i.e., the first insulation layer) and the top gate electrode 22 are sequentially formed through the opening of the photoresist layer 8 by a self-alignment method, and orthographic projections of the opening, the active layer 4, the gate insulation layer 3 and the top gate electrode 22 on the substrate 1 completely overlap each other.

Figure 5D:
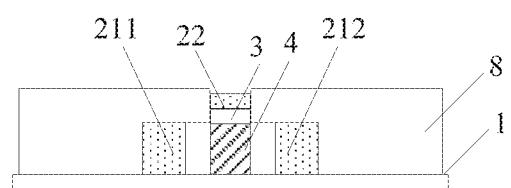

In this step, on the basis of the structure subjected to step S1, the photoresist is not removed, and the film layers of the active layer 4, the gate insulation layer 3 and the top gate electrode 22 are sequentially formed by deposition by a self-alignment method, and the active layer 4, the gate insulation layer 3 and the top gate electrode 22 are formed by a patterning process, as illustrated in FIG. 5D. The active layer 4 may be made of a transparent conductive oxide semiconductor, and may also be made of a silicon-based material such as a-Si or p-Si, or various organic materials, etc. The gate insulation layer 3 may be made of various commonly used insulating materials, and may also be made of high-k dielectric materials, etc. The length of the conductive channel of the active layer 4 formed through self-alignment deposition and patterning can be at sub-micron level and independent of the photolithography precision, and the on current Ion is further improved on the basis of increasing the width of the conductive channel.

In step S22, the photoresist layer 8 is removed by peeling off.

Figure 5E:
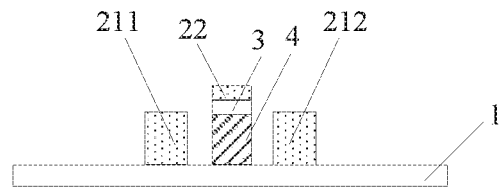

In this step, the photoresist over the top gate electrode 22 is removed using a peeling-off process, as illustrated in FIG. 5E.

In the step of forming the first bottom gate electrode 211, the second bottom gate electrode 212, the active layer 4, the gate insulation layer 3 and the top gate electrode 22, due to the mask function of the photoresist and the lateral etching of the wet etching, the structure of the thin film transistor having a unique shape is easy to fabricate, and the fabrication process is simplified.

In step S3, the source electrode 5 and the drain electrode 6 are formed on opposite sides of the active layer 4 in the horizontal direction, and the arrangement direction of the source electrode 5, the active layer 4, and the drain electrode 6 are perpendicular to the arrangement direction of the first bottom gate electrode 211 and the second bottom gate electrode 212.

In this step, referring to FIG. 4B, a conductive material is deposited as a source/drain film layer on both sides of the active layer 4, and the patterns of the source electrode 5 and the drain electrode 6 are formed by photolithography.

In step S4, a second insulation layer is formed over the active layer 4, the source electrode 5, and the drain electrode 6.

Figure 5F:
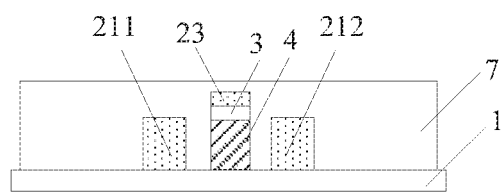

In this step, an insulating material such as silicon oxide (SiOx), silicon nitride (SiNx), aluminum oxide (AlOx) or the like is directly deposited, on the basis of the structure subjected to step S3, and a portion of the insulating material fills a gap between the sides of the bottom gate electrodes and the active layer 4 to serve as the gate insulation layer 3 of the bottom gate electrode 21, while other portions thereof including the insulating material higher than the bottom gate electrode 21 may directly serve as the passivation layer 7 (i.e., the second insulation layer) of the entire thin film transistor device, as illustrated in FIG. 5F.

In the method of fabricating the thin film transistor, by properly designing the fabrication sequence and process of each layer structure, the active layer 4 faces the gate electrode 2 with an insulation layer therebetween, and is in contact with the source electrode 5 and the drain electrode 6 on both sides, increasing the contact area and the on current Ion.

In the thin film transistor shown in FIGS. 4A and 4B, the patterns of the active layer 4, the gate insulation layer 3, and the top gate electrode 22 are formed by combining the undercut phenomenon of the wet etching process with the self-alignment method using the photoresist as a mask, which saves process steps and reduces process difficulty. Meanwhile, the gate insulation layer 3 and the passivation layer 7 are simultaneously formed by one deposition process, which further saves process steps.

The thin film transistor illustrated in FIGS. 4A and 4B simplifies the process steps on the basis of the thin film transistor illustrated in FIGS. 2A and 2B, and the gate electrode is fabricated by self-alignment using the photoresist, and the on current Ion is increased.

Figure 6A:
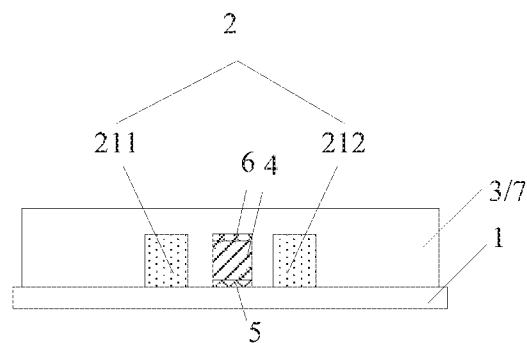
FIG. 6A is a structural cross-sectional view of a thin film transistor according to an embodiment of the present disclosure.
Figure 6B:
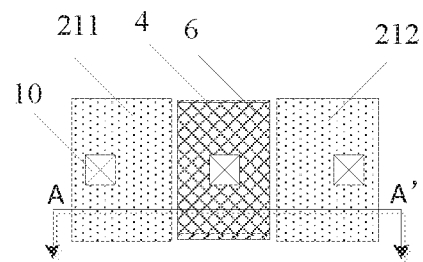
FIG. 6B is a top view of the thin film transistor according to the embodiment of the present disclosure.

FIGS. 6A and 6B show a thin film transistor in some embodiments, and FIG. 6A is a cross-sectional view taken along line AA' of FIG. 6B. As illustrated in FIGS. 6A and 6B, in this thin film transistor, the gate electrode 2 includes a first bottom gate electrode 211 (an example of the first portion of the gate electrode in FIGS. 6A to 7F) and a second bottom gate electrode 212 (an example of the second portion of the gate electrode in FIGS. 6A to 7F). The first bottom gate electrode 211, the second bottom gate electrode 212, and the active layer 4 are at least partially disposed in a same layer such that at least a portion of the gate electrode 2 is in the same range as the active layer 4 in the height direction. The first bottom gate electrode 211 and the second bottom gate electrode 212 respectively have the first side surface and the second side surface of the gate electrode 2 facing each other (for example, a right side surface of the first bottom gate electrode 211 and a left side surface of the second bottom gate electrode 212). The active layer 4 is between the first bottom gate electrode 211 and the second bottom gate electrode 212, and has a third side surface (for example, a left side surface of the active layer 4 in the figures) facing, insulated from and spaced apart from the first side surface of the gate electrode 2 and a fourth side surface (for example, a right side surface of the active layer 4 in the figures) facing, insulated from and spaced apart from the second side surface of the gate electrode 2. The source electrode 5 and the drain electrode 6 are respectively on and under the active layer 4 and in contact with the active layer, and orthographic projections of the source electrode 5 (the source electrode 5 is not shown in FIG. 6B because it is under the active layer 4), the active layer 4 and the drain electrode 6 on the substrate 1 completely overlap each other. The thin film transistor is designed to have a bottom-gate structure such that the active layer 4 faces the gate electrode 2, with an insulation layer therebetween, on both sides (for example, a left side and a right side in FIG. 6A) in the horizontal direction, and is in contact with the source electrode 5 and the drain electrode 6 on both sides (for example, an upper side and a lower side in FIG. 6A) in the vertical direction, thereby increasing the contact area and increasing the on current Ion.

In some embodiments, as illustrated in FIG. 6B, a center connection line (for example, along the horizontal direction) connecting a center of the first bottom gate electrode 211 and a center of the second bottom gate electrode 212 is perpendicular to a center connection line (for example, along the vertical direction) connecting a center of the source electrode 5 and a center of the drain electrode 6. By designing the distribution of the source electrode 5, the drain electrode 6, and the bottom gate electrodes with respect to the active layer 4, the on current Ion is increased.

The first bottom gate electrode 211 and the second bottom gate electrode 212 formed in the thin film transistor may be applied with a gate voltage to form a conductive path on the sides of the active layer 4, which is equivalent to increasing the width of the conductive channel, thereby improving the current driving capability of the thin film transistor device. The first bottom gate electrode 211 and the second bottom gate electrode 212 can also effectively shield the active layer 4 from light scattered inside the display device in which the active layer 4 is located, and since electrode structures such as the source electrode and the drain electrode are disposed on and under the active layer 4, the effect of shielding the top and bottom of the active layer 4 from light is also good.

A method of fabricating the thin film transistor in FIGS. 6A and 6B will be described below. Considering that the thin film transistor shown in FIGS. 4A and 4B cannot shield the bottom of the active layer 4 from light, the thin film transistor shown in FIGS. 6A and 6B and the fabrication method thereof are further improved, that is, after forming the bottom gate electrodes 21 on both sides, film layers of the source electrode 5, the active layer 4, and the drain electrode 6 are sequentially formed from bottom to top, and are patterned by self-alignment using the photoresist and a lift-off process, thereby forming a thin film transistor having a vertical structure.

As illustrated in FIGS. 7A to 7F, the method of fabricating the thin film transistor specifically includes the following steps S1 to S3.

In step S1, the first bottom gate electrode 211 and the second bottom gate electrode 212 separated from each other are formed. The step S1 may include steps S11 and S12.

In step S11, the gate film layer 20 and the photoresist layer 8 are formed, and the photoresist layer 8 is formed to have an opening exposing a portion of the gate film layer 20.

Figure 7A:
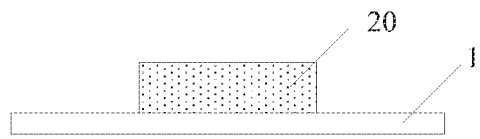
FIGS. 7A to 7F are schematic diagrams illustrating a fabrication process of the thin film transistor shown in FIG. 6A.

In this step, after the substrate 1 is cleaned by a standard method, a layer of conductive metal material or other conductive material is deposited on the substrate 1 as the gate film layer 20; a photoresist is coated on the gate film layer 20, and a photolithography process is performed on the gate film layer 20 to form an island-like structure, as illustrated in FIG. 7A.

Figure 7B:
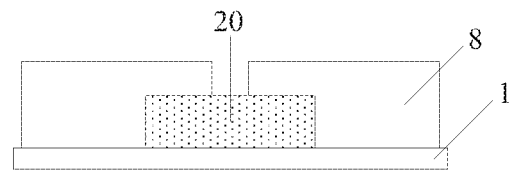

Then, a photoresist is coated on the substrate 1 and the gate film layer 20, and the photoresist in the middle of the gate film layer 20 is removed to form the photoresist layer 8 having an opening, as illustrated in FIG. 7B. The adhesion between the photoresist and the gate electrode layer is reduced by using a special photoresist material, by lowering the temperature of the photoresist in the baking and not performing the post-baking process, or by other methods. However, the present disclosure is not limited thereto, as long as the adhesion between the photoresist and the gate film layer can be reduced and the realization of the lateral etching can be facilitated.

In step S12, the gate film layer 20 is subjected to wet etching so that the liquid etchant laterally etches at the contact surface of the photoresist layer 8 with the gate film layer 20, thereby completely removing the portion (for example, the orthographic projection of the portion on the substrate 1 completely overlaps the orthographic projection of the opening on the substrate 1) of the gate film layer 20 exposed by the opening and removing a portion of the gate film layer 20 that is in contact with the portion exposed by the opening in the horizontal direction, so as to form the first bottom gate electrode 211 and the second bottom gate electrode 212 separated from each other.

Figure 7C:
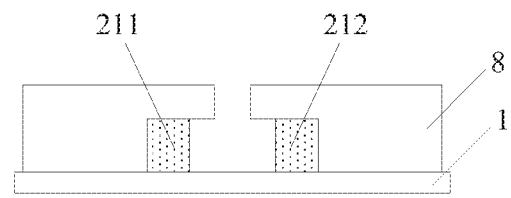

In this step, the device is placed in the liquid etchant for wet etching, and since the adhesion between the photoresist and the material of the gate electrode is small, the liquid etchant conducts lateral etching of a certain degree under the photoresist while etching the material downwardly, and this phenomenon is utilized to form the side gate structure, as illustrated in FIG. 7C.

In step S2, the source electrode 5, the active layer 4, and the drain electrode 6 are sequentially formed between the first bottom gate electrode 211 and the second bottom gate electrode 212. Step S2 includes steps S21 and S22.

In step S21, the source electrode 5, the active layer 4, and the drain electrode 6 are sequentially formed through the opening of the photoresist layer 8 by a self-alignment method, and orthographic projections of the opening, the source electrode 5, the active layer 4, and the drain electrode 6 on the substrate 1 completely overlap each other.

Figure 7D:
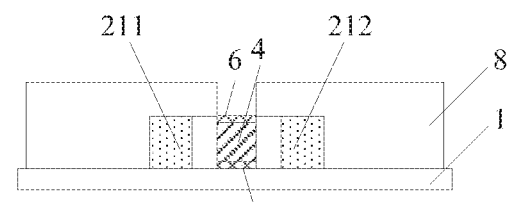

In this step, on the basis of the structure subjected to step S1, the photoresist is not removed, and the source electrode 5, the active layer 4 and the drain electrode 6 are sequentially formed by deposition by a self-alignment method, as illustrated in FIG. 7D. The material of the source/drain film layer may be selected be the same as the material of the gate film layer 20. The active layer 4 may be a transparent conductive oxide semiconductor, and may also be a silicon-based material such as a-Si or p-Si, or various organic materials, etc. In this step, the size advantage of the thin film transistor is achieved by self-alignment deposition, and the length of the conductive channel of the active layer 4 can be at sub-micron level and independent of the photolithography precision, which not only broadens the process tolerance, but also effectively increases the on current Ion.

In step S22, the photoresist layer is removed by peeling off.

Figure 7E:
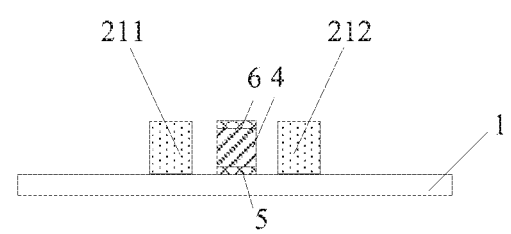

In this step, the photoresist over the gate electrode is removed using a peeling-off process, as illustrated in FIG. 7E.

In the step of forming the source electrode 5, the active layer 4 and the drain electrode 6 between the first bottom gate electrode 211 and the second bottom gate electrode 212, due to the mask function of the photoresist and the lateral etching of the wet etching, the unique structure of the thin film transistor is easy to fabricate, and the fabrication process is simplified In step S3, an insulation layer is formed on the first bottom gate electrode 211, the second gate electrode 212 and the drain electrode 6.

Figure 7F:
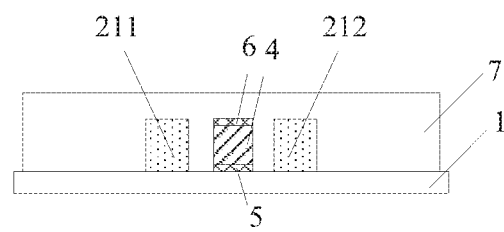

In this step, an insulating material such as silicon oxide (SiOx), silicon nitride (SiNx), aluminum oxide (AlOx) or the like is directly deposited on the basis of the structure subjected to step S2, and a portion of the insulating material fills a gap between the bottom gate electrode 21 and the active layer 4 to serve as the gate insulation layer 3, while other portions thereof including the insulating material higher than the existing patterns may directly serve as the passivation layer 7 (PVX) of the device, as illustrated in FIG. 7F, thereby improving the reliability of the device.

In the method of fabricating the thin film transistor, by properly designing the fabrication sequence and process of each layer structure, the active layer 4 is formed to face the gate electrode 2 with an insulation layer therebetween, and in contact with the source electrode 5 and the drain electrode 6 on both sides, increasing the contact area and the on current Ion.

The thin film transistor illustrated in FIGS. 4A and 4B is implemented as a thin film transistor having a vertical structure, and achieves increased on current Ion and improved shielding of light, and the fabrication method thereof is simple. Specifically, in the thin film transistor, the bottom gate electrodes are formed on opposite sides of the active layer in the horizontal direction to achieve an effect of increasing the on current Ion; and at the same time, in addition to the simplified fabrication method, the technical effect of completely encircling the active layer 4 to shield the active layer from light is realized by providing the source electrode 5 and the drain electrode 6 on and under the active layer 4.

Compared with the thin film transistor illustrated in FIGS. 2A and 2B and the thin film transistor illustrated in FIGS. 4A and 4B, in the thin film transistor illustrated in FIGS. 6A and 6B, the source electrode and the drain electrode do not need to be fabricated by a separate step, and the drain electrode on the active layer and the source electrode under the active layer can be made very thin, and thus have small overlapping areas with the gate electrode, which is advantageous for reducing the parasitic capacitance Cgs of the device and increasing the operating frequency.

The principle of increasing the on current Ion of the thin film transistor according to the embodiments of the present disclosure will be described below. The formula of drain-source current $I_{DS}$ of the thin film transistor is as follows:

$$I_{DS} = \frac{W_{eff}}{L} \mu_n C_{OX} \left[ (V_{GS} - V_{TH})V_{DS} - \frac{1}{2}V_{DS}^2 \right]$$

The thin film transistor of the embodiments of the present disclosure utilizes at least one of the side surfaces, the upper surface and the lower surface of the active layer to form a conductive channel, which increases the effective channel width $W_{eff}$ (for example, in the thin film transistor as illustrated in FIGS. 2A and 2B, $W_{eff}=W_{upper}+W_{lower}+2W_{side}$) of the oxide thin film transistor so that the width-to-length ratio $W_{eff}/L$ of the thin film transistor is increased, thereby effectively increasing the on current Ion (i.e., $I_{DS}$) of the thin film transistor, and improving the current driving capability of the oxide thin film transistor.

In addition, in the oxide thin film transistors according to the embodiments of the present disclosure, the effect of shielding the active layer from light by the electrodes is taken into consideration, thereby minimizing the influence of illumination on the $V_{TH}$ drift of the device and improving the negative bias illumination stability of the thin film transistor.

The thin film transistor illustrated in FIGS. 2A and 2B and the fabrication method thereof utilize an anode oxidization process to form the gate insulation layer 3, and the thin film transistor illustrated in FIGS. 4A and 4B and the fabrication method thereof and the thin film transistor illustrated in FIGS. 6A and 6B and the fabrication method thereof utilize the undercut phenomenon to realize a fabrication scheme of self-alignment. They can all save process cost and reduce the difficulty of fabricating the device.

The thin film transistor illustrated in FIGS. 2A and 2B and the fabrication method thereof utilize the method of thermal oxidation or anode oxidation to form the gate insulation layer, thereby making the gate insulation layer dense, and ensuring the control effect of the gate electrode on the active layer.

In the thin film transistor illustrated in FIGS. 4A and 4B and the fabrication method thereof and the thin film transistor illustrated in FIGS. 6A and 6B and the fabrication method thereof, the gate insulation layer and the passivation layer are simultaneously formed by one deposition process, which further saves process steps.

In the thin film transistor illustrated in FIGS. 4A and 4B and the thin film transistor illustrated in FIGS. 6A and 6B, the length of the conductive channel of the active layer deposited by self-alignment can be at sub-micron level and independent of the photolithography precision, which not only broadens the process tolerance, but also further increases the on current Ion.

In the thin film transistor illustrated in FIGS. 6A and 6B, the drain electrode on the active layer and the source electrode under the active layer can be made very thin, and thus have small overlapping areas with the gate electrode, which is advantageous for reducing the parasitic capacitance.

In another aspect, embodiments of the present disclosure provide an array display device including any of the above thin film transistors.

The array substrate may be utilized to form a display device, and the display device may be any product or component with a display function, such as a desktop computer, a tablet computer, a laptop computer, a mobile phone, a PDA, a GPS, an on-board display, a projection display, a video camera, a digital camera, an electronic watch, a calculator, an electronic instrument, a gauge, a liquid crystal panel, an electronic paper, a television, a monitor, a digital photo frame, a navigator, or the like.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present disclosure, and these variations and improvements shall also fall into the protection scope of the present disclosure.

What is claimed is:
1. A thin film transistor, comprising
a gate electrode on a substrate and having a first side surface and a second side surface opposite to each other in a horizontal direction; and
an active layer between the first side surface and the second side surface of the gate electrode and having a third side surface and a fourth side surface,
wherein the third side surface of the active layer and the first side surface of the gate electrode are opposite to and spaced apart from each other in the horizontal direction, the fourth side surface of the active layer and the second side surface of the gate electrode are opposite to and spaced apart from each other in the horizontal direction, and a distance of at least one portion of the gate electrode in a vertical direction from the substrate is equal to a distance of at least one portion of the active layer in the vertical direction from the substrate,
wherein the gate electrode comprises a first portion and a second portion separated from each other, the first portion has the first side surface, and the second portion has the second side surface, and the first portion and the second portion are in the same range as the at least one portion of the active layer in a height direction, and the first portion and the second portion are respectively on opposite two sides of the active layer in the horizontal direction and spaced apart from the active layer, and
wherein the thin film transistor further comprises a passivation layer covering the gate electrode and the active layer and formed integrally, and a gap between the active layer and each of the first portion and the second portion is completely filled with the passivation layer.

2. The thin film transistor of claim 1, wherein the gate electrode further comprises a third portion separated from the first portion and the second portion, the third portion being on a side of the active layer away from the substrate and an orthographic projection of the third portion on the substrate completely overlapping an orthographic projection of the active layer on the substrate.

3. The thin film transistor of claim 2, further comprising a source electrode and a drain electrode, wherein the source electrode and the drain electrode are at substantially the same level as the active layer, and the source electrode and the drain electrode are respectively on opposite two sides of the active layer in a horizontal direction and electrically coupled to the active layer.

4. The thin film transistor of claim 3, wherein the first portion and the second portion are arranged along a first direction, and the source electrode, the active layer, and the drain electrode are sequentially arranged along a second direction, the first direction and the second direction being perpendicular to each other.

5. The thin film transistor of claim 1, further comprising a source electrode and a drain electrode, wherein one of the source electrode and the drain electrode is on a side of the active layer proximal to the substrate and electrically coupled to the active layer, and the other of the source electrode and the drain electrode is on a side of the active layer away from the substrate and electrically coupled to the active layer.

6. The thin film transistor of claim 5, wherein orthographic projections of the source electrode, the active layer, and the drain electrode on the substrate completely overlap each other.

7. The thin film transistor of claim 6, wherein a center connection line connecting a center of the first portion and a center of the second portion is perpendicular to a center connection line connecting a center of the source electrode and a center of the drain electrode.

8. The thin film transistor of claim 1, wherein the gate electrode is made of a material capable of shielding light.

9. A method of fabricating a thin film transistor, comprising steps of:
  forming a gate electrode on a substrate, the gate electrode being formed to have a first side surface and a second side surface opposite to each other in a horizontal direction;
  forming an active layer, the active layer being formed to be between the first side surface and the second side surface of the gate electrode and have a third side surface and a forth side surface; and
  forming a passivation layer integrally, the passivation layer being formed to cover the gate electrode and the active layer,
  wherein the active layer and the gate electrode are formed such that the third side surface of the active layer and the first side surface of the gate electrode are opposite to and spaced apart from each other in the horizontal direction, the fourth side surface of the active layer and the second side surface of the gate electrode are opposite to and spaced apart from each other in the horizontal direction, and a distance of at least one portion of the gate electrode in a vertical direction from the substrate is equal to a distance of at least one portion of the active layer in the vertical direction from the substrate, and
  wherein the step of forming the gate electrode comprises forming a first portion and a second portion separated from each other, the first portion is formed to have the first side surface, the second portion is formed to have the second side surface, and the first portion and the second portion are formed to be in the same range as the at least one portion of the active layer in a height direction and respectively on opposite two sides of the active layer in the horizontal direction and spaced apart from the active layer, and
  a gap between the active layer and each of the first portion and the second portion is completely filled with the passivation layer.

10. The method of claim 9, wherein the method further comprises steps of:
  after forming the active layer, forming a first insulation layer and a third portion of the gate electrode on a side of the active layer away from the substrate, the third portion being formed to be between the first portion and the second portion and separated from the first portion and the second portion, and an orthographic projection of the third portion on the substrate completely overlapping an orthographic projection of the active layer on the substrate;
  after forming the first insulation layer and the third portion of the gate electrode, forming a source electrode and a drain electrode on opposite two sides of the active layer in the horizontal direction, the source electrode and the drain electrode being formed to be at substantially the same level as the active layer and electrically coupled to the active layer; and
  after forming the source electrode and the drain electrode, forming the passivation layer on a side of the active layer, the source electrode and the drain electrode away from the substrate.

11. The method of claim 10, wherein the step of forming the first portion and the second portion of the gate electrode comprises:
  forming a gate film layer and a photoresist layer, the photoresist layer being formed to cover the gate film layer and have an opening exposing a portion of the gate film layer; and
  wet-etching the gate film layer to completely remove the portion of the gate film layer exposed by the opening and remove a portion of the gate film layer that is in contact with the portion exposed by the opening in the horizontal direction, so as to form the first portion and the second portion separated from each other, and
  the step of forming the active layer, the first insulation layer, and the third portion of the gate electrode comprises:
  sequentially forming the active layer, the first insulation layer and the third portion through the opening of the photoresist layer by a self-alignment method, such that orthographic projections of the opening, the active layer, the first insulation layer, and the third portion on the substrate completely overlap each other; and
  peeling off the photoresist layer.

12. An array substrate, comprising the thin film transistor of claim 1.

* * * * *